United States Patent
Iwanaga

(10) Patent No.: US 9,774,312 B2
(45) Date of Patent: Sep. 26, 2017

(54) ANTENNA MATCHING APPARATUS

(71) Applicant: Murata Manufacturing Co., Ltd., Nagaokakyo-shi, Kyoto-fu (JP)

(72) Inventor: Minoru Iwanaga, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/270,023

(22) Filed: Sep. 20, 2016

(65) Prior Publication Data

US 2017/0012599 A1    Jan. 12, 2017

Related U.S. Application Data

(63) Continuation of application No. PCT/JP2014/080711, filed on Nov. 20, 2014.

(30) Foreign Application Priority Data

Apr. 1, 2014  (JP) ................. 2014-075480

(51) Int. Cl.
| | |
|---|---|
| *H01Q 7/00* | (2006.01) |
| *H01Q 21/00* | (2006.01) |
| *H03H 7/38* | (2006.01) |
| *H03H 7/40* | (2006.01) |
| *H01Q 21/29* | (2006.01) |
| *H04B 1/00* | (2006.01) |
| *H01Q 1/24* | (2006.01) |
| *H03H 7/01* | (2006.01) |
| *H03H 7/18* | (2006.01) |

(52) U.S. Cl.
CPC .............. *H03H 7/38* (2013.01); *H01Q 1/243* (2013.01); *H01Q 21/29* (2013.01);
(Continued)

(58) Field of Classification Search
CPC .......... H01Q 21/29; H01Q 1/243; H01Q 1/50; H01Q 7/00; H01Q 21/00; H03H 7/40; H03H 7/38; H03H 7/46
See application file for complete search history.

(56) References Cited

U.S. PATENT DOCUMENTS 6,928,298 B2 * 8/2005 Furutani ................ H03H 7/463
                                                                455/553.1
7,064,612 B2 * 6/2006 Akamine .............. H03F 1/0272
                                                                330/129
(Continued)

FOREIGN PATENT DOCUMENTS

JP    2006-246070 A    9/2006
JP    2008-160226 A    7/2008
(Continued)

OTHER PUBLICATIONS

English translation of Official Communication issued in corresponding International Application PCT/JP2014/080711, dated Jan. 20, 2015.

*Primary Examiner* — Tho G Phan
(74) *Attorney, Agent, or Firm* — Keating & Bennett, LLP

(57) ABSTRACT

A high pass filter includes a first end connected to a first terminal and is a filter that transmits a signal in a first frequency band. A second terminal is connected to a second end of the high pass filter. A first switch includes a first end connected to the second end of the high pass filter. A third terminal is connected to a second end of the first switch. A low pass filter includes a first end connected to the first terminal and is a filter that transmits a signal in a second frequency band lower than the first frequency band. A fourth terminal is connected to a second end of the low pass filter. A second switch includes a first end connected to the second end of the low pass filter. A fifth terminal is connected to the second end of the second switch.

20 Claims, 13 Drawing Sheets

(51) Int. Cl.
*H03H 7/46* (2006.01)
*H03H 1/00* (2006.01)

(52) U.S. Cl.
CPC ............ *H03H 7/0115* (2013.01); *H03H 7/18* (2013.01); *H03H 7/40* (2013.01); *H03H 7/46* (2013.01); *H04B 1/0064* (2013.01); *H03H 7/463* (2013.01); *H03H 2001/0085* (2013.01)

(56) References Cited

U.S. PATENT DOCUMENTS

| | | | | |
|---|---|---|---|---|
| 7,388,281 | B2* | 6/2008 | Krueger | H03H 9/0557 257/678 |
| 8,699,966 | B2* | 4/2014 | Shibata | H04B 1/0057 333/133 |
| 9,276,319 | B2* | 3/2016 | Vazquez | H01Q 9/06 |
| 2003/0227357 | A1* | 12/2003 | Metzger | H03H 9/0557 333/189 |
| 2008/0238682 | A1* | 10/2008 | Kuwako | G06K 7/0008 340/572.4 |
| 2009/0201209 | A1 | 8/2009 | Boyle | |
| 2013/0083439 | A1 | 4/2013 | Hayakawa | |
| 2013/0249767 | A1 | 9/2013 | Ishizuka et al. | |
| 2015/0087254 | A1 | 3/2015 | Iwanaga | |

FOREIGN PATENT DOCUMENTS

| | | |
|---|---|---|
| JP | 2008-539642 A | 11/2008 |
| WO | 2011/152256 A1 | 12/2011 |
| WO | 2012/099085 A1 | 7/2012 |
| WO | 2014/013765 A1 | 1/2014 |

* cited by examiner

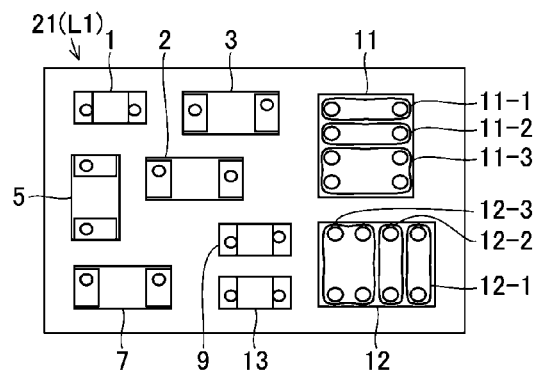
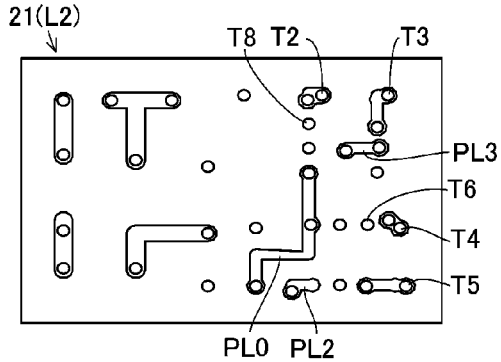
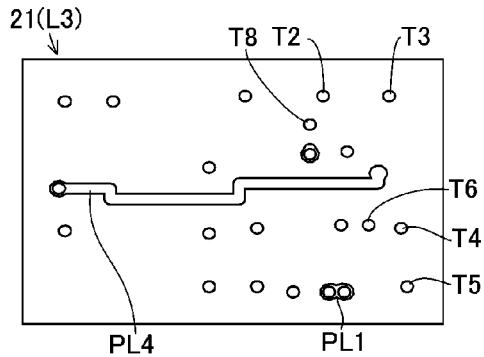

ANTENNA MATCHING APPARATUS

CROSS REFERENCE TO RELATED APPLICATIONS

This application claims the benefit of priority to Japanese Patent Application 2014-075480 filed Apr. 1, 2014 and is a Continuation application of PCT/JP2014/080711 filed on Nov. 20, 2014. The entire contents of each application are hereby incorporated herein by reference.

BACKGROUND OF THE INVENTION

1. Field of the Invention

The present invention relates to an antenna matching apparatus.

2. Description of the Related Art

Mobile communication terminals supporting multiple frequency bands (multiband mobile communication terminals) have hitherto been in practical use. The multiple frequency bands are composed of, for example, a combination of a relatively low frequency band (low band) and a relatively high frequency band (high band). Excellent transmission-reception characteristics are required of the mobile communication terminals in both the low band and the high band.

Japanese Unexamined Patent Application Publication No. 2006-246070 discloses an antenna element having a configuration in which a matching circuit is capable of being switched. With this configuration, the antenna element is matched with any of multiple bands.

Japanese Unexamined Patent Application Publication No. 2008-160226 discloses a reception apparatus matched with any of multiple bands. This reception apparatus adjusts the impedance of a matching circuit in accordance with a variation in impedance of an antenna.

Technologies have been developed in recent years in which transmission and/or reception is performed by simultaneously using multiple frequency bands to improve the communication speeds of mobile communication terminals. Such technologies are exemplified by a technology called carrier aggregation defined in Long Term Evolution (LTE) (Registered Trademark) Advanced standard. Such technologies are simply referred to as "carrier aggregation" in the following description. In the carrier aggregation, the respective bands, for example, the low band and the high band are simultaneously used.

The antenna element described in Japanese Unexamined Patent Application Publication No. 2006-246070 and the reception apparatus described in Japanese Unexamined Patent Application Publication No. 2008-160226 are each configured so as to appropriately adjust the matching circuit for one band, among the respective multiple bands. When the matching circuit is adjusted for one band in the carrier aggregation, the matching is not appropriately performed for the other bands. As a result, since the transmission-reception characteristics and so on in the other bands are reduced, the communication performance achieved by the carrier aggregation is degraded.

SUMMARY OF THE INVENTION

Preferred embodiments of the present invention provide an antenna matching apparatus capable of suppressing reduction in transmission-reception characteristics in respective bands in carrier aggregation.

According to a preferred embodiment of the present invention, an antenna matching apparatus includes a first terminal, a second terminal, a third terminal, a fourth terminal, a fifth terminal, a high pass filter, a low pass filter, a first switch, and a second switch. The high pass filter includes one end connected to the first terminal. The high pass filter is a filter that transmits a signal in a first frequency band. The second terminal is connected to the other end of the high pass filter. The first switch includes one end connected to the other end of the high pass filter. The third terminal is connected to the other end of the first switch. The low pass filter includes one end connected to the first terminal. The low pass filter is a filter that transmits a signal in a second frequency band lower than the first frequency band. The fourth terminal is connected to the other end of the low pass filter. The second switch includes one end connected to the other end of the low pass filter. The fifth terminal is connected to the other end of the second switch.

The antenna matching apparatus having the above configuration may be mounted in, for example, a mobile communication terminal and may be used in the following manner. The first terminal is connected to a transmission-reception circuit in the mobile communication terminal. A high band antenna is connected to either one of the second and third terminals. A matching element for the high band antenna is connected to the second and third terminals. A low band antenna is connected to either one of the fourth and fifth terminals. A matching element for the low band antenna is connected to the fourth and fifth terminals. Accordingly, the transmission-reception circuit in the mobile communication terminal is connected to the high band antenna with the matching element and the high pass filter (or the high pass filter and the first switch) interposed therebetween. The transmission-reception circuit in the mobile communication terminal is connected to the low band antenna with the matching element and the low pass filter (or the low pass filter and the second switch) interposed therebetween. The provision of the matching elements achieves excellent matching in both the high band and the low band. Accordingly, even when the low band and the high band are simultaneously used in carrier aggregation, the communication performance achieved by the carrier aggregation is realized.

According to various preferred embodiments of the present invention, it is possible to suppress reduction in transmission-reception characteristics in each band in the carrier aggregation to improve the communication performance.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7 is a diagram illustrating a layer L1 of a multilayer substrate 21.

FIG. 8 is a diagram illustrating a layer L2 of the multilayer substrate 21.

FIG. 9 is a diagram illustrating a layer L3 of the multilayer substrate 21.

DETAILED DESCRIPTION OF THE PREFERRED EMBODIMENTS

Figure 1:
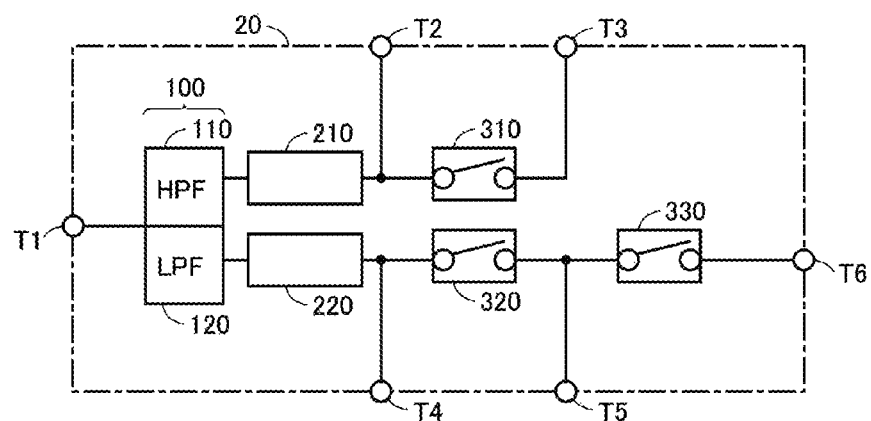
FIG. 1 is a diagram illustrating an antenna matching apparatus according to a preferred embodiment of the present invention.

Preferred embodiments of the present invention will herein be described in detail with reference to the attached drawings. The same reference numerals are used in the drawings to identify the same or corresponding components. A description of such components is not repeated.

FIG. 1 is a diagram illustrating an antenna matching apparatus according to a preferred embodiment of the present invention. Referring to FIG. 1, an antenna matching apparatus 20 includes terminals T1 to T6, a diplexer 100, phase circuits 210 and 220, and switches 310, 320, and 330.

The diplexer 100 includes a high pass filter (HPF) 110 and a low pass filter (LPF) 120. The HPF 110 is used to transmit a signal in a high band (first frequency band). The LPF 120 is used to transmit a signal in a low band (second frequency band). The low band frequency is lower than the high band frequency. The frequency band of the high band is, for example, about 1,500 MHz to about 3,500 MHz and the frequency band of the low band is, for example, about 600 MHz to about 1,200 MHz.

The diplexer 100 is connected to the terminal T1 (first terminal). More specifically, the HPF 110 and the LPF 120 are connected to the terminal T1. In other words, the HPF 110 has one end connected to the terminal T1. The LPF 120 has one end connected to the terminal T1.

The phase circuit 210 (first phase circuit) shifts (rotates) the phase of a high band signal. When it is not necessary to shift the phase, the antenna matching apparatus 20 may omit the phase circuit 210. The phase circuit 220 (second phase circuit) is used to shift the phase of a low band signal. When it is not necessary to shift the phase, the antenna matching apparatus 20 may omit the phase circuit 220. The phase circuits will be described in more detail below with reference to FIG. 5.

The terminal T2 (second terminal) is connected to the other end of the HPF 110 with the phase circuit 210 interposed therebetween. When the antenna matching apparatus 20 does not include the phase circuit 210, the terminal T2 is directly connected to the HPF 110.

The switch 310 (first switch) is connected to the other end of the HPF 110 with the phase circuit 210 interposed therebetween. When the antenna matching apparatus 20 does not include the phase circuit 210, the switch 310 is directly connected to the other end of the HPF 110. In other words, the switch 310 has one end connected to the other end of the HPF 110.

The terminal T3 (third terminal) is connected to the other end of the switch 310.

The terminal T4 (fourth terminal) is connected to the other end of the LPF 120 with the phase circuit 220 interposed therebetween. When the antenna matching apparatus 20 does not include the phase circuit 220, the terminal T4 is directly connected to the other end of the LPF 120.

Similarly, the switch 320 (second switch) is connected to the other end of the LPF 120 with the phase circuit 220 interposed therebetween. When the antenna matching apparatus 20 does not include the phase circuit 220, the switch 320 is directly connected to the other end of the LPF 120. In other words, the switch 320 has one end connected to the other end of the LPF 120.

The terminal T5 (fifth terminal) is connected to the other end of the switch 320.

The switch 330 (third switch) is connected to the other end of the switch 320. In other words, the switch 330 has one end connected to the other end of the switch 320.

The terminal T6 (sixth terminal) is connected to the other end of the switch 330.

The antenna matching apparatus 20 may be used in, for example, a mobile communication terminal (not illustrated in FIG. 1). In particular, the antenna matching apparatus 20 is preferably used in a mobile communication terminal supporting the carrier aggregation.

Figure 2:
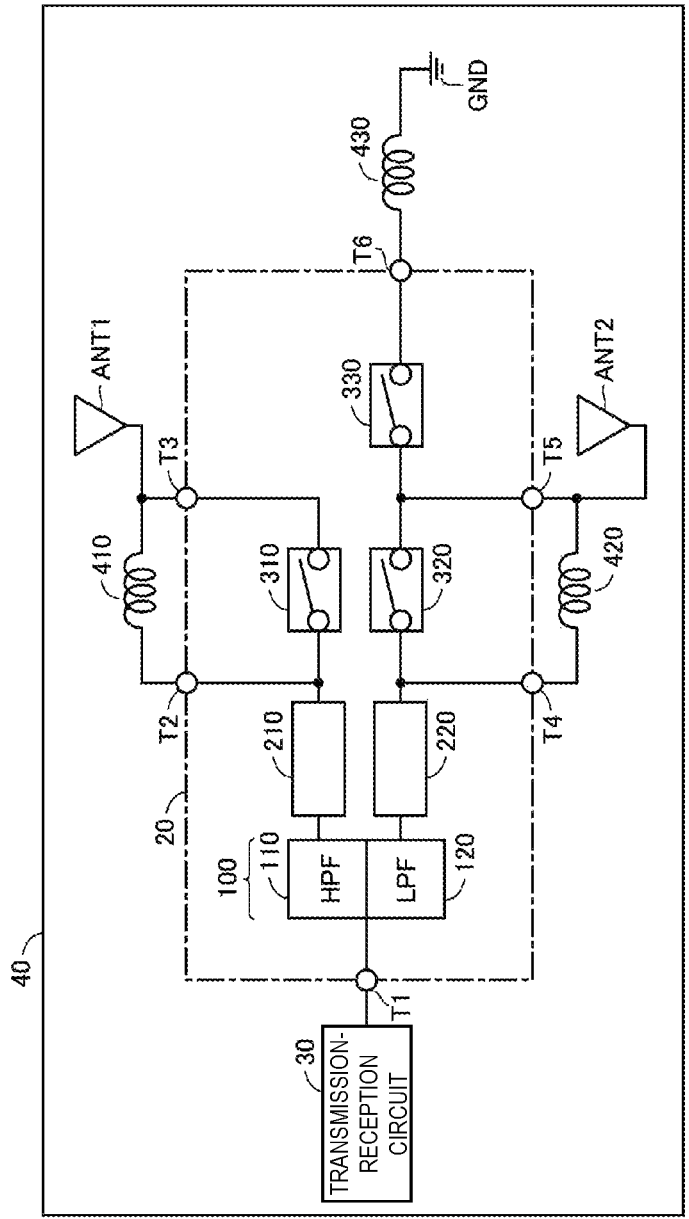
FIG. 2 is a diagram illustrating an application of an antenna matching apparatus according to a preferred embodiment of the present invention.

FIG. 2 is a diagram illustrating an example application of the antenna matching apparatus 20. The antenna matching apparatus 20 is connected to a transmission-reception circuit 30 in a mobile communication terminal 40. Specifically, the terminal T1 is connected to the transmission-reception circuit 30. In the carrier aggregation, the transmission-reception circuit 30 is capable of simultaneously processing the low band signal and the high band signal. For example, the communication speed of the mobile communication terminal 40 is increased through the carrier aggregation.

In the carrier aggregation, for example, the high band signal from the HPF 110 is input into the terminal T1 and the high band signal from the transmission-reception circuit 30 is output to the terminal T1. Simultaneously, the low band signal from the LPF 120 is input into the terminal T1 and the low band signal from the transmission-reception circuit 30 is output to the terminal T1. In other words, the high band signal is input into and output to the terminal T1 and, simultaneously, the low band frequency signal is input into and output to the terminal T1.

The high band signal from the HPF 110 is a signal of a reception frequency in the high band and the high band signal from the transmission-reception circuit 30 is a signal of a transmission frequency in the high band. Similarly, the low band signal from the LPF 120 is a signal of a reception frequency in the low band and the low band signal from the transmission-reception circuit 30 is a signal of a transmission frequency in the low band.

In the carrier aggregation supporting only reception, only either of the low band signal and the high band signal may be output from the transmission-reception circuit 30 to the terminal T1. In the carrier aggregation supporting only transmission, only either of the low band signal and the high band signal may be input into the terminal T1.

In the example illustrated in FIG. 2, ANT1 is connected to the terminal T3. ANT1 denotes a high band antenna that transmits and receives the high band signal.

An inductor 410 is provided between the terminal T2 and the terminal T3. The inductor 410 is a matching element for ANT1. When the switch 310 is turned off (OFF), the inductor 410 functions as the matching element for ANT1. When the switch 310 is turned on (ON), the inductor 410 does not function as the matching element for ANT1 because the inductor 410 is bypassed with the switch 310. When the inductor 410 is not necessary for the matching of ANT1, the inductor 410 may be omitted.

The transmission-reception circuit 30 can be connected to ANT1 with the matching element (the inductor 410) interposed therebetween. In the example illustrated in FIG. 2, the inductor 410 can be connected in series to ANT1. The inductor 410 that functions as the matching element for ANT1 improves the matching in the high band. This enables excellent matching in the high band.

ANT2 is connected to the terminal T5. ANT2 denotes a low band antenna that transmits and receives the low band signal.

An inductor 420 is provided between the terminal T4 and the terminal T5. The inductor 420 is a matching element for ANT2. When the switch 320 is turned off, the inductor 420 functions as the matching element for ANT2. When the switch 320 is turned on, the inductor 420 does not function as the matching element for ANT2 because the inductor 420 is bypassed with the switch 320. When the inductor 420 is not necessary for the matching of ANT2, the inductor 420 may be omitted.

One end of an inductor 430 is connected to the terminal T6. The other end of the inductor 430 is connected to the ground (GND). The ground has a reference potential. In the example illustrated in FIG. 2, when the switch 330 is turned on, the inductor 430 functions as the matching element for ANT2. When the switch 330 is turned off, the inductor 430 does not function as the matching element for ANT2. When the inductor 430 is not necessary for the matching of ANT2, the inductor 430 may be omitted and the terminal T6 may be opened.

The transmission-reception circuit 30 can be connected to ANT2 with the matching elements (the inductor 420 and the inductor 430) interposed therebetween. In the example illustrated in FIG. 2, the inductor 420 can be connected in series to ANT2 and the inductor 430 can be shunt-connected to ANT2. The inductor 420 and the inductor 430 that function as the matching elements for ANT2 improve the matching in the low band. This enables excellent matching in the low band.

With the example illustrated in FIG. 2, the antenna matching apparatus 20 realizes excellent matching in both the high band and the low band. Accordingly, even when the high band and the low band are simultaneously used in the carrier aggregation, excellent communication performance is realized in the mobile communication terminal 40. Although the inductors are illustrated as the matching elements in FIG. 2, the matching elements are not limited to the inductors. The matching elements may be capacitors. The same applies to FIG. 3 and FIG. 4 described below.

Figure 3:
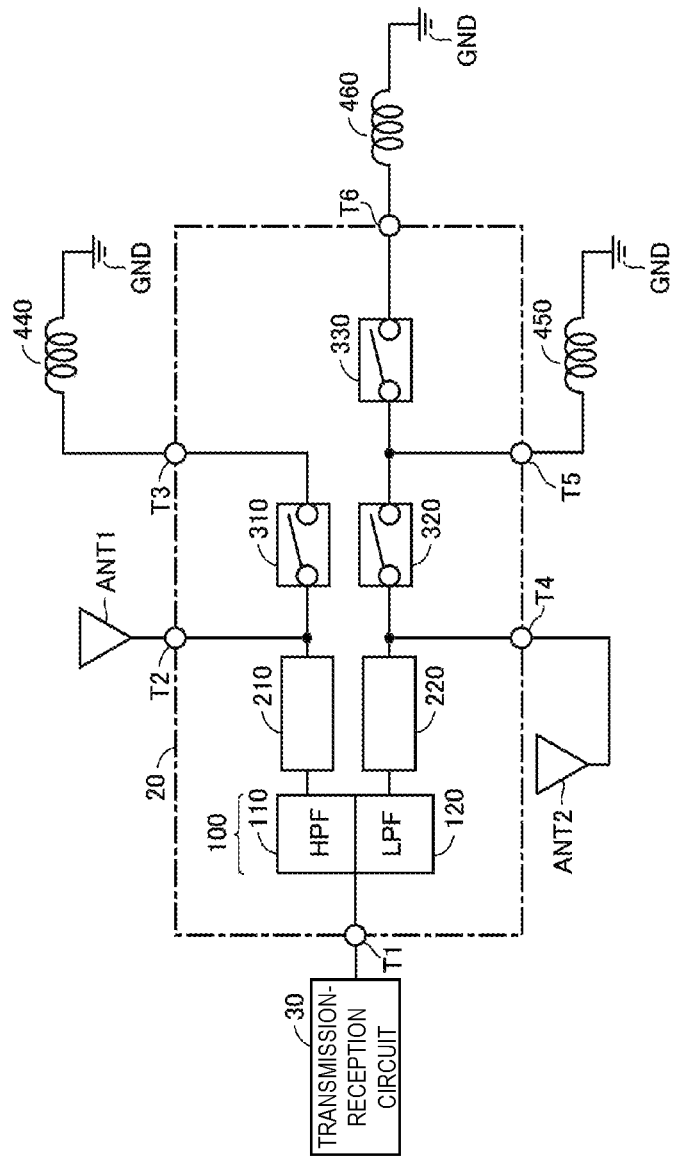
FIG. 3 is a diagram illustrating another application of an antenna matching apparatus according to a preferred embodiment of the present invention.

FIG. 3 is a diagram illustrating another example application of the antenna matching apparatus 20. The illustration of the mobile communication terminal is omitted in FIG. 3 and FIG. 4 described below.

In the example illustrated in FIG. 3, ANT1 is connected to the terminal T2.

One end of an inductor 440 is connected to the terminal T3. The other end of the inductor 440 is grounded. When the switch 310 is turned on, the inductor 440 functions as the matching element for ANT1. When the switch 310 is turned off, the inductor 440 does not function as the matching element for ANT1. When the inductor 440 is not necessary for the matching of ANT1, the inductor 440 may be omitted and the terminal T3 may be opened.

The transmission-reception circuit 30 and ANT1 can be configured so as to include the matching element (the inductor 440). In the example illustrated in FIG. 3, the inductor 440 can be shunt-connected to ANT1. The inductor 440 that functions as the matching element for ANT1 improves the matching in the high band. This enables excellent matching in the high band.

ANT2 is connected to the terminal T4. One end of an inductor 450 is connected to the terminal T5. The other end of the inductor 450 is grounded. When the switch 320 is turned on, the inductor 450 functions as the matching element for ANT2. When the switch 320 is turned off, the inductor 450 does not function as the matching element for ANT2. When the inductor 450 is not necessary for the matching of ANT2, the inductor 450 may be omitted and the terminal T5 may be opened.

One end of an inductor 460 is connected to the terminal T6. The other end of the inductor 460 is grounded. When the switch 330 is turned on, the inductor 460 functions as the matching element for ANT2. When the switch 330 is turned off, the inductor 460 does not function as the matching element for ANT2.

The transmission-reception circuit 30 can be connected to ANT2 with the matching elements (the inductor 450 and the inductor 460) interposed therebetween. In the example illustrated in FIG. 3, the inductor 450 and the inductor 460 can be shunt-connected to ANT2. The inductor 450 and the inductor 460 that function as the matching elements improve the matching in the low band. This enables excellent matching in the low band.

With the example illustrated in FIG. 3, the antenna matching apparatus 20 realizes excellent matching in both the high band and the low band. Accordingly, even when the high band and the low band are simultaneously used in the carrier aggregation, excellent communication performance is realized in the mobile communication terminal.

In the first example application (FIG. 2), the inductor 410 is connected in series to ANT1 and the inductor 420 is connected in series to ANT2. In the second example application (FIG. 3), the inductor 440 is shunt-connected to ANT1 and the inductor 450 is shunt-connected to ANT2. The matching elements are provided in the antenna matching apparatus 20 in various modes, as described above. Accordingly, the degree of freedom of the matching is increased.

Figure 4:
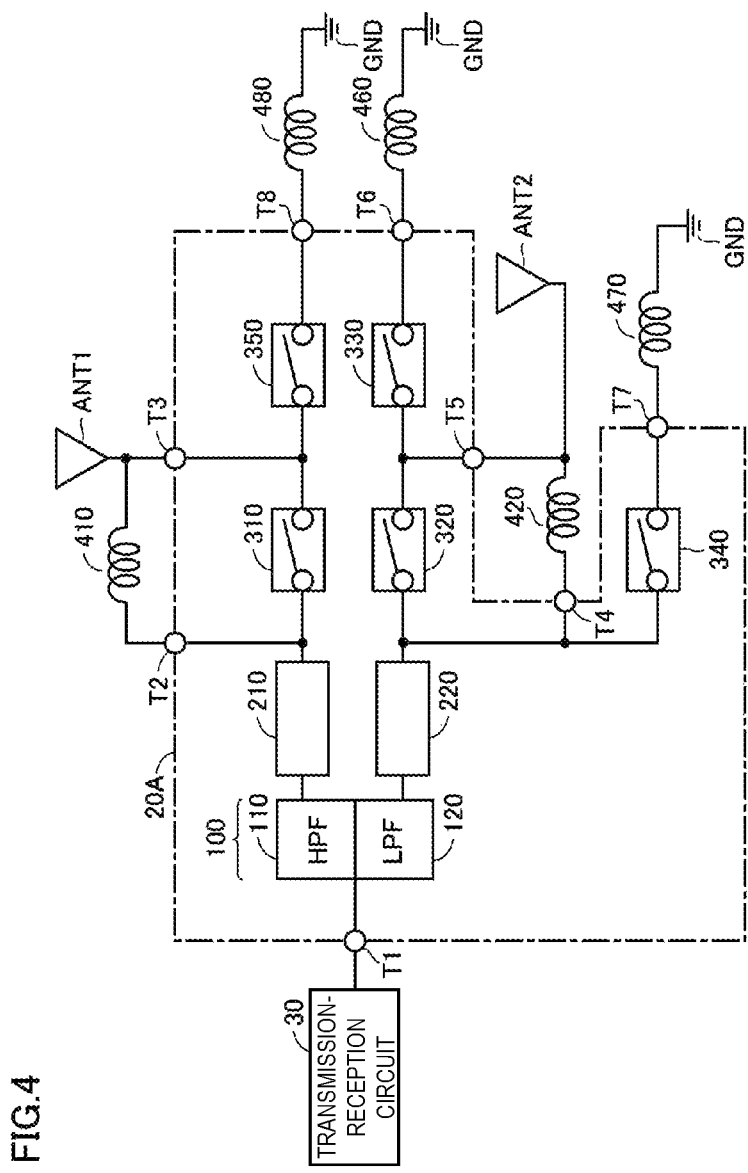
FIG. 4 is a diagram illustrating a modification of an antenna matching apparatus according to a preferred embodiment of the present invention.

FIG. 4 is a diagram illustrating a modification of an antenna matching apparatus according to a preferred embodiment of the present invention. Referring to FIG. 4, an antenna matching apparatus 20A differs from the antenna matching apparatus 20 (for example, FIG. 1) in that the antenna matching apparatus 20A further includes terminals T7 and T8 and switches 340 and 350. Since the configuration of the other components in the antenna matching apparatus 20A is the same as that of the corresponding components in the antenna matching apparatus 20 illustrated in, for example, FIG. 1, a description of the configuration of the other components in the antenna matching apparatus 20A is not repeated here.

The switch 340 (fourth switch) is connected to the other end of the LPF 120 with the phase circuit 220 interposed therebetween. When the antenna matching apparatus 20A does not include the phase circuit 220, the switch 340 is directly connected to the other end of the LPF 120. In other words, the switch 340 has one end connected to the other end of the LPF 120.

The terminal T7 (seventh terminal) is connected to the other end of the switch 340.

One end of an inductor 470 is connected to the terminal T7. The other end of the inductor 470 is grounded. When the switch 340 is turned on, the inductor 470 functions as the matching element for ANT2. When the switch 340 is turned off, the inductor 470 does not function as the matching element for ANT2. When the inductor 470 is not necessary for the matching of ANT2, the inductor 470 may be omitted and the terminal T7 may be opened.

The transmission-reception circuit 30 can be connected to ANT2 with the matching elements (the inductor 420, the inductor 460, and the inductor 470) interposed therebetween. In the example illustrated in FIG. 4, the inductor 420 can be connected in series to ANT2 and the inductor 460 and the inductor 470 can be shunt-connected to ANT2. The antenna matching apparatus 20A that includes the three matching elements including the inductor 420, the inductor 460, and the inductor 470, achieves more excellent matching in the low band, compared with the configuration in FIG. 2 or FIG. 3.

The switch 350 (fifth switch) is connected to the other end of the switch 310. In other words, the switch 350 has one end connected to the other end of the switch 310.

The terminal T8 (eighth terminal) is connected to the other end of the switch 350.

One end of an inductor 480 is connected to the terminal T8. The other end of the inductor 480 is grounded. When the switch 350 is turned on, the inductor 480 functions as the matching element for ANT1. When the switch 350 is turned off, the inductor 480 does not function as the matching element for ANT1. When the inductor 480 is not necessary for the matching of ANT1, the inductor 480 may be omitted and the terminal T8 may be opened.

The transmission-reception circuit 30 can be connected to ANT1 with the matching elements (the inductor 410 and the inductor 480) interposed therebetween. In the example illustrated in FIG. 4, the inductor 410 can be connected in series to ANT1 and the inductor 480 can be shunt-connected to ANT1. The antenna matching apparatus 20A that includes the two matching elements including the inductor 410 and the inductor 480, achieves more excellent matching in the high band, compared with the configuration in FIG. 2 or FIG. 3.

In the configuration illustrated in FIG. 4, a variable capacitance element may be arranged, instead of the switch 340. Adjusting the capacitance of the variable capacitance element increases the degree of freedom of the matching. Minimizing the capacitance of the variable capacitance element and causing the variable capacitance element to have high impedance allow the function of the inductor 470 as the matching element to be suppressed. The same applies to the switch 350.

The antenna matching apparatus 20A includes a larger number of matching elements, compared with the antenna matching apparatus 20 illustrated in, for example, FIG. 1. This allows the antenna matching apparatus 20A to achieve more excellent matching in both the high band and the low band, compared with the antenna matching apparatus 20. Accordingly, even when the low band and the high band are simultaneously used in the carrier aggregation, excellent communication performance is realized in the mobile communication terminal.

The antenna matching apparatus 20 may include the phase circuits (the phase circuit 210 and the phase circuit 220), as described above with reference to FIG. 1.

Figure 5:
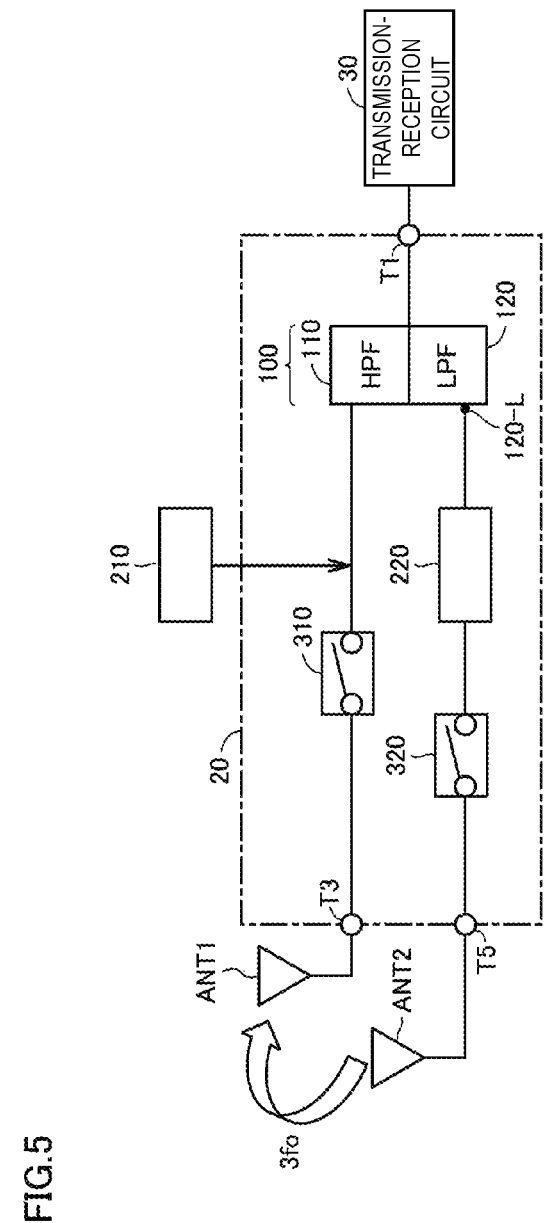
FIG. 5 is a diagram conceptually illustrating the effect achieved by phase circuits.

FIG. 5 is a diagram conceptually illustrating the effect achieved by the phase circuits. The terminals T1, T3, and T5, the diplexer 100, the phase circuit 220, and the switches 310 and 320 in the antenna matching apparatus 20 are illustrated in FIG. 5 for convenience and the other components are not illustrated in FIG. 5. The transmission-reception circuit 30 is connected to the terminal T1. ANT1 is connected to the terminal T3. ANT2 is connected to the terminal T5.

In the carrier aggregation, for example, the transmission-reception circuit 30 supplies (outputs) a low-band transmission signal to the terminal T1 and simultaneously receives low-band and high-band reception signals from the terminal T1. In the carrier aggregation, the transmission-reception circuit 30 may further supply (output) a high-band transmission signal to the terminal T1 and may simultaneously receive low-band and high-band reception signals from the terminal T1.

When the antenna matching apparatus 20 does not include the phase circuit 210 and the phase circuit 220, the low-band transmission signal from the transmission-reception circuit 30 passes through the LPF 120 and the switch 320 and is transmitted from ANT2. At this time, harmonic waves having a frequency of an integer multiple of the frequency of the transmission signal may be generated as a spurious signal in the switch 320. For example, third harmonic waves of the transmission signal may be generated as the spurious signal. The spurious signal generated in the switch 320 is transmitted from ANT2 (denoted by "3fo"). Specifically, a portion of the spurious signal generated in the switch 320 is directly supplied to ANT2 through the terminal T5 and is transmitted from ANT2. The remaining spurious signal is reflected from one end (120-L) of the LPF 120, is supplied to ANT2 through the switch 320 and the terminal T5, and is transmitted from ANT2. This phenomenon also occurs in harmonic waves having frequencies of integer multiples.

The frequency of the spurious signal may be overlapped with the high band frequency. As described above, for example, the low band is about 600 MHz to about 1,200 MHz and the high band is about 1,500 MHz to about 3,500 MHz. Accordingly, for example, the frequencies of third harmonic waves of frequencies from 600 MHz to 1,167 MHz in the low band are overlapped with frequencies from 1,800 MHz to 3,500 MHz in the high band. When the third harmonic waves of the low band are overlapped with the high band, the spurious signal transmitted from ANT2 is received with ANT1 and reaches the transmission-reception circuit 30. The communication performance (for example, receiving sensitivity) in the high band is reduced due to the influence of the spurious signal that has reached the transmission-reception circuit 30. The same problems may occur when the frequencies of integral multiples of frequencies in the low band are overlapped with frequencies in the high band, in addition to the third harmonic waves.

When the antenna matching apparatus 20 includes the phase circuit 220, a portion of the spurious signal generated in the switch 320 is directly supplied to ANT2 and is transmitted from ANT2. In contrast, after passing through the phase circuit 220 and being reflected from one end (120-L) of the LPF 120, the remaining spurious signal passes through the phase circuit 220 again, is supplied to ANT2, and is transmitted from ANT2. Appropriately designing the phase circuit 220 causes a portion of the spurious signal that is directly supplied to ANT and the remaining spurious signal that is reflected from the LPF 120 and then reaches ANT2 to cancel out each other. As a result, almost no spurious signal is transmitted from ANT2, thus suppressing the reduction in communication performance (for example, receiving sensitivity) in the high band.

When the phase of the spurious signal is rotated by 90 degrees with the phase circuit 220, a portion of the spurious signal that is directly supplied to ANT and the remaining spurious signal that is reflected from the LPF 120 and then reaches ANT2 cancel out each other successfully. Accordingly, the phase circuit 220 is preferably configured so as to shift (rotate) the phase of a signal having a certain frequency in the high band by 90 degrees, for example. The phase circuit 220 preferably includes a distributed constant line, such as a microstrip line. The phase circuit 220 may preferably include a lumped constant circuit including an inductor, a capacitor, and so on.

The phase circuit 210 may be provided between the switch 310 and the HPF 110. For example, when the high band signal is transmitted from ANT1, a spurious signal may be generated in the switch 310. The provision of the phase circuit 210 suppresses the spurious signal.

An antenna matching apparatus according to a preferred embodiment of the present invention preferably includes, for example, a substrate. The substrate may be, for example, a multilayer substrate. An example of the multilayer substrate realizing an antenna matching apparatus according to a preferred embodiment of the present invention will now be described with reference to FIG. 6 to FIG. 22.

Figure 6:
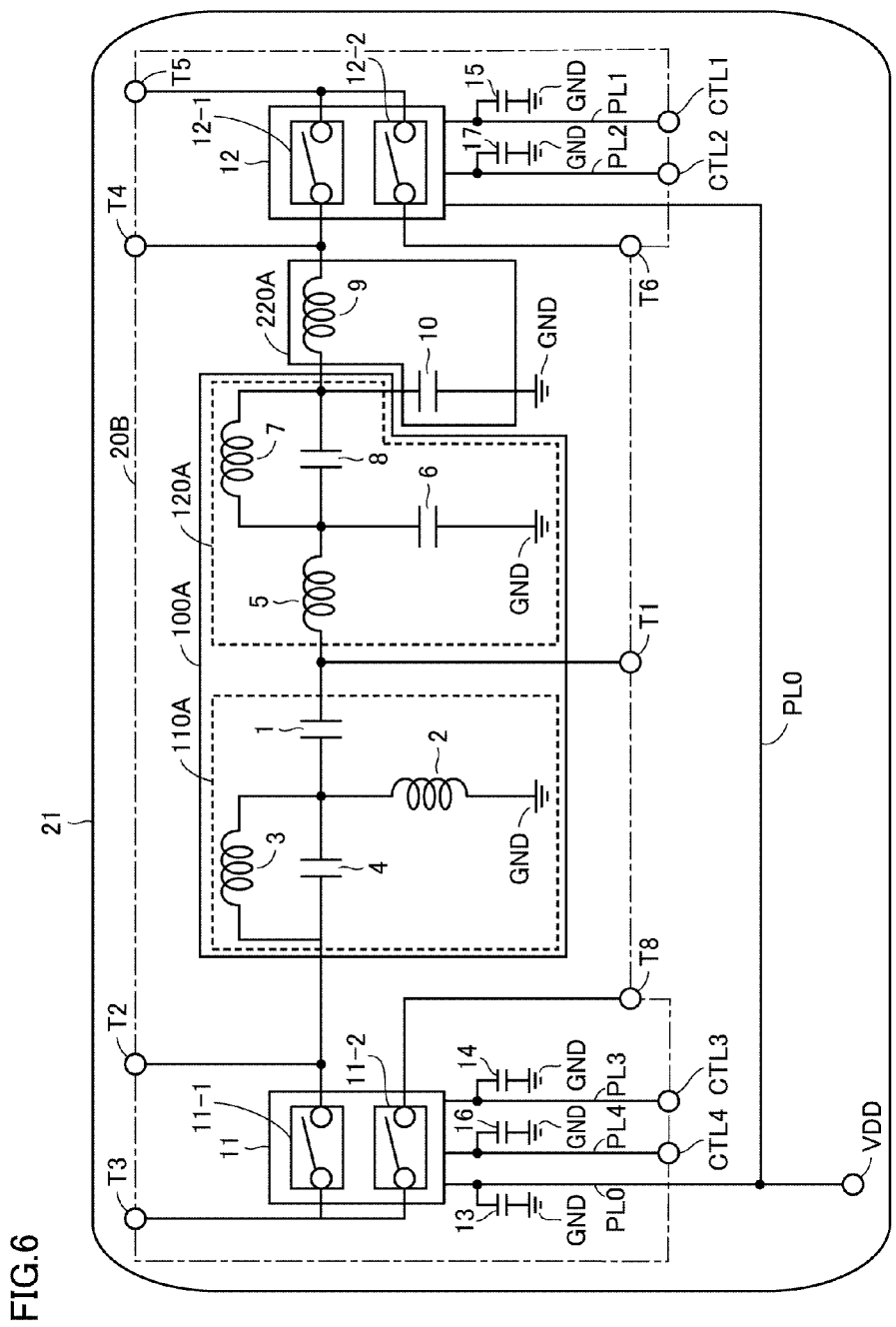
FIG. 6 is a diagram illustrating an exemplary antenna matching apparatus provided in a multilayer substrate.

FIG. 6 is a diagram illustrating an exemplary antenna matching apparatus provided in or on a multilayer substrate. Referring to FIG. 6, each element included in an antenna matching apparatus 20B is provided in a multilayer substrate 21. The antenna matching apparatus 20B includes the terminals T1 to T6 and T8, a diplexer 100A, switch circuits 11 and 12, a phase circuit 220A, control terminals CTL1 to CTL4, (at least a portion of) voltage supply lines PL0 to PL4, and capacitors 13 to 17. The capacitors 13 to 17 define and function as bypass capacitors to remove noise on the voltage supply lines PL0 to PL4. Since the terminals T1 to T6 and T8 are terminals similar to the terminals T1 to T6 and T8 in the antenna matching apparatus 20 described above with reference to FIG. 1 to FIG. 3 and the antenna matching apparatus 20A described above with reference to FIG. 4, a description of the terminals T1 to T6 and T8 is not repeated here.

The diplexer 100A includes a high pass filter (HPF) 110A and a low pass filter (LPF) 120A. The diplexer 100A, the HPF 110A, and the LPF 120A in FIG. 6 correspond to, for example, the diplexer 100, the HPF 110, and the LPF 120 in FIG. 4, respectively.

The HPF 110A includes a capacitor 1, a capacitor 4, an inductor 2, and an inductor 3. The capacitor 1 and the inductor 2 are arranged in an L-shaped configuration in order to transmit the high band signal and one end of the inductor 2 is grounded. The inductor 3 and the capacitor 4 are connected in series to the terminal T2 and are arranged so as to attenuate a signal of a certain frequency in the low band through parallel resonance. The HPF 110A may be realized by, for example, a surface acoustic wave (SAW) filter.

The LPF 120A includes an inductor 5, an inductor 7, a capacitor 6, and a capacitor 8. The inductor 5 and the capacitor 6 are arranged in an L-shaped configuration in order to transmit a signal of a certain frequency in the low band frequency and one end of the capacitor 6 is grounded. The inductor 7 and the capacitor 8 are connected in series to an inductor 9 and are arranged so as to attenuate a signal of a certain frequency in the high band through the parallel resonance. The LPF 120A may be realized by, for example, a SAW filter.

The phase circuit 220A shifts the phase of the low band signal. The phase circuit 220A in FIG. 6 corresponds to the phase circuit 220 in FIG. 4. The phase circuit 220A includes the inductor 9 and a capacitor 10. It is preferred that the inductor 9 and the capacitor 10 be arranged in an L-shaped configuration so as to rotate (shift) the phase of a signal having a certain frequency in the high band by 90 degrees and one end of the capacitor 10 be grounded.

The switch circuit 11 includes a switch 11-1 and a switch 11-2. For example, a single pole double throw (SPDT) switch is preferably used as each of the switch 11-1 and the switch 11-2. The switch circuit 11 may be integrated into one chip and may be realized as an integrated circuit (IC). The switch 11-1 and the switch 11-2 in FIG. 6 correspond to, for example, the switch 310 and the switch 350 in FIG. 4, respectively.

The voltage supply lines PL0, PL3, and PL4 are provided to supply voltage to the switch circuit 11. Power supply voltage VDD, a control signal from the control terminal CTL3, and a control signal from the control terminal CTL4 are supplied to the switch circuit 11 through the voltage supply lines PL0, PL3, and PL4, respectively. The power supply voltage VDD is supplied to the switch 11-1 and the switch 11-2. The switch 11-1 is controlled with the control signal from the control terminal CTL3 and the switch 11-2 is controlled with the control signal from the control terminal CTL4.

The switch circuit 12 includes a switch 12-1 and a switch 12-2. As in the switch 11-1 and the switch 11-2, for example, an SPDT switch is used as each of the switch 12-1 and the switch 12-2. Like the switch circuit 11, the switch circuit 12 may be integrated into one chip and may be realized as an IC. The switch 12-1 and the switch 12-2 in FIG. 6 correspond to, for example, the switch 320 and the switch 330 in FIG. 4, respectively.

The voltage supply lines PL0, PL1, and PL2 are provided to supply voltage to the switch circuit 12. The power supply voltage VDD, a control signal from the control terminal CTL1, and a control signal from the control terminal CTL2 are supplied to the switch circuit 12 through the voltage supply lines PL0, PL1, and PL2, respectively. The power supply voltage VDD is supplied to the switch 12-1 and the switch 12-2. The switch 12-1 is controlled with the control signal from the control terminal CTL1 and the switch 12-2 is controlled with the control signal from the control terminal CTL2.

The voltage supply lines PL0 is grounded with the capacitor 13 interposed therebetween, the voltage supply line PL1 is grounded with the capacitor 15 interposed therebetween, the voltage supply line PL2 is grounded with the capacitor 17 interposed therebetween, the voltage supply line PL3 is grounded with the capacitor 14 interposed therebetween, and the voltage supply line PL4 is grounded with the capacitor 16 interposed therebetween. The provision of the capacitors 13 to 17, for example, stabilizes the voltage at the voltage supply lines PL0 to PL4 and suppresses noise of the power supply or noise from the switches. Accordingly, the operations of the switches 11-1, 11-2, 12-1, and 12-2 are stabilized.

In the antenna matching apparatus 20B, the capacitors 4, 6, 8, 10, 14, 15, 16, and 17 are provided on or in inner layers of the multilayer substrate 21.

Although the material of the multilayer substrate 21 is not specifically limited, the multilayer substrate 21 is formed of, for example, a dielectric (insulator) made of ceramics or resin. Selection of an appropriate material allows, for example, desired permittivity to be achieved in the multilayer substrate 21.

FIG. 7 to FIG. 22 are diagrams illustrating a wiring pattern (layout) of each layer of the multilayer substrate 21. In the example illustrated in these drawings, the multilayer substrate 21 is a substrate including 16 layers, for example.

Figure 22:
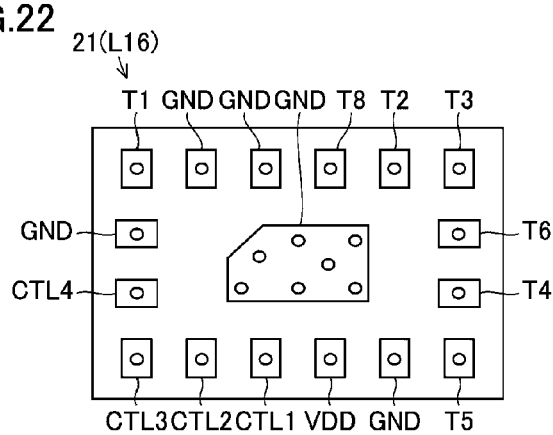
FIG. 22 is a diagram illustrating a layer L16 of the multilayer substrate 21.

The multilayer substrate 21 has a configuration in which layers from a layer L1 (FIG. 7) to a layer L16 (FIG. 22) are laminated in this order. The layer L1 to the layer L16 are laminated in the thickness direction of the multilayer substrate 21. The wiring pattern illustrated in FIG. 22 indicates the wiring pattern on a surface opposite to the layer L15 when the layer L16 is laminated, on the surfaces of the layer L16. In other words, the layer L16 illustrated in FIG. 22 is laminated in an upside-down state.

The layer L1 (FIG. 7) includes a mounting surface on which discrete components, such as capacitors and switches, among the components included in the antenna matching apparatus 20B, are mounted. The layer L16 (FIG. 22) includes terminals to access the outside of the antenna matching apparatus 20B (for example, another substrate on which the multilayer substrate 21 is mounted).

The layer L2 (FIG. 8) to the layer L15 (FIG. 21) are the inner layers of the multilayer substrate 21. Necessary wiring patterns are provided on the inner layers depending on the arrangement of the respective discrete components mounted on the layer L1 and the arrangement of the respective terminals provided on the layer L16.

Portions denoted by white circles (○) in FIG. 7 to FIG. 22 indicate via holes (vias). The wiring patterns on the respective layers of the multilayer substrate 21 are electrically connected to each other via the vias.

Referring to FIG. 7, for example, the capacitors 1 and 13, the inductors 2, 3, 5, 7, and 9, and the switch circuits 11 and 12 are provided on the layer L1 as the discrete components.

The switch circuit 11 illustrated in FIG. 7 includes a logic circuit portion 11-3, which is not illustrated in FIG. 6. The logic circuit portion 11-3 includes logic circuits and so on for the switches 11-1 and 11-2. The power supply voltage VDD and the respective control signals to control the switches 11-1 and 11-2 are supplied to the logic circuit portion 11-3. Similarly, the switch circuit 12 includes a logic circuit portion 12-3, which is not illustrated in FIG. 6. The logic circuit portion 12-3 includes logic circuits and so on for the switches 12-1 and 12-2. The power supply voltage VDD and the respective control signals for controlling the switches 12-1 and 12-2 are supplied to the logic circuit portion 12-3.

Referring to FIG. 8, for example, a portion of the voltage supply line PL0, a portion of the voltage supply line PL2, and a portion of the voltage supply line PL3 are provided as the wiring patterns on the layer L2.

Referring to FIG. 9, for example, a portion of the voltage supply line PL1 and a portion of the voltage supply line PL4 are provided as the wiring patterns on the layer L3.

Figure 10:
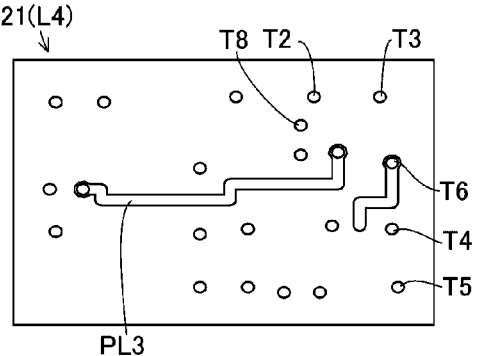
FIG. 10 is a diagram illustrating a layer L4 of the multilayer substrate 21.

Referring to FIG. 10, for example, a portion of the voltage supply line PL3 is provided as the wiring pattern on the layer L4.

Figure 11:
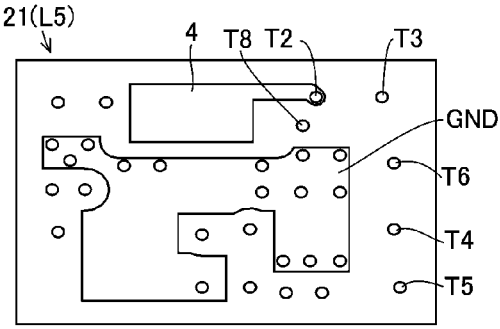
FIG. 11 is a diagram illustrating a layer L5 of the multilayer substrate 21.

Referring to FIG. 11, for example, a portion of the electrode of the capacitor 4 and the ground surface (GND) are provided as the wiring patterns on the layer L5. Since the layer L5 includes the ground surface, for example, isolation between the respective layers is ensured.

Figure 12:
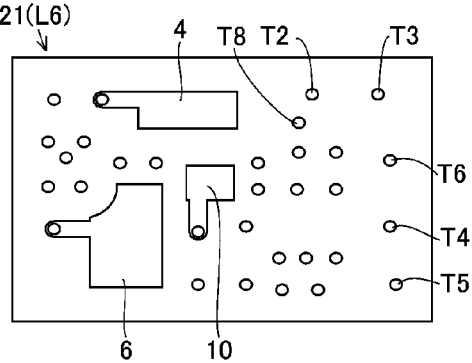
FIG. 12 is a diagram illustrating a layer L6 of the multilayer substrate 21.

Referring to FIG. 12, for example, a portion of the electrode of the capacitor 4, a portion of the electrode of the capacitor 6, and one electrode of the capacitor 10 are provided as the wiring patterns on the layer L6.

Figure 13:
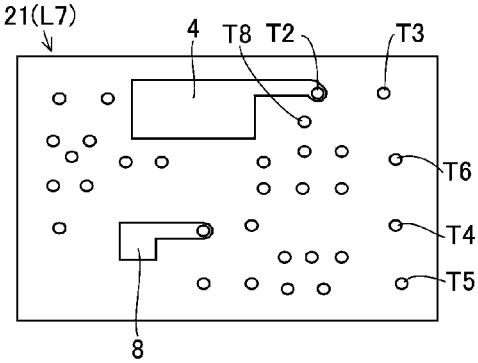
FIG. 13 is a diagram illustrating a layer L7 of the multilayer substrate 21.

Referring to FIG. 13, for example, a portion of the electrode of the capacitor 4 and the electrode of the capacitor 8 are provided as the wiring patterns on the layer L7.

Figure 14:
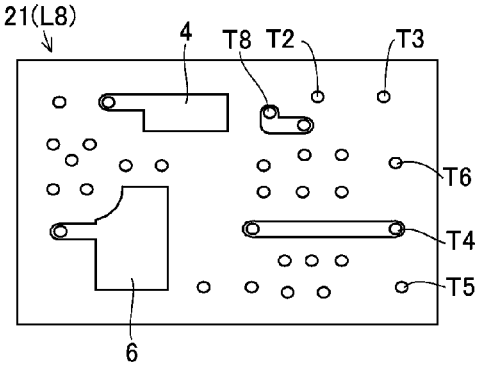
FIG. 14 is a diagram illustrating a layer L8 of the multilayer substrate 21.

Referring to FIG. 14, for example, a portion of the electrode of the capacitor 4 and a portion of the electrode of the capacitor 6 are provided as the wiring patterns on the layer L8.

Figure 15:
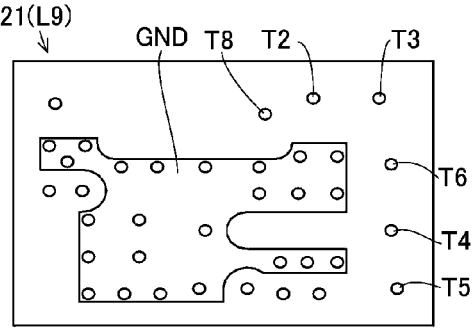
FIG. 15 is a diagram illustrating a layer L9 of the multilayer substrate 21.

Referring to FIG. 15, for example, the ground surface is provided as the wiring pattern on the layer L9. Since the layer L9 includes the ground surface, for example, the isolation between the respective layers is ensured.

Figure 16:
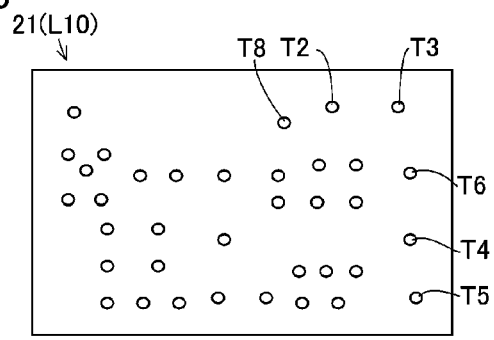
FIG. 16 is a diagram illustrating a layer L10 of the multilayer substrate 21.

Referring to FIG. 16, for example, almost no wiring pattern is provided on the layer L10. The layer L10 may be used as an auxiliary layer to increase the wiring pattern.

Figure 17:
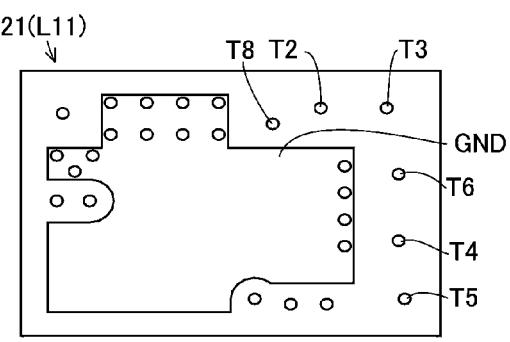
FIG. 17 is a diagram illustrating a layer L11 of the multilayer substrate 21.

Referring to FIG. 17, for example, the ground surface is provided by the wiring pattern on the layer L11. Since the layer L11 includes the ground surface, for example, the isolation between the respective layers is ensured.

Figure 18:
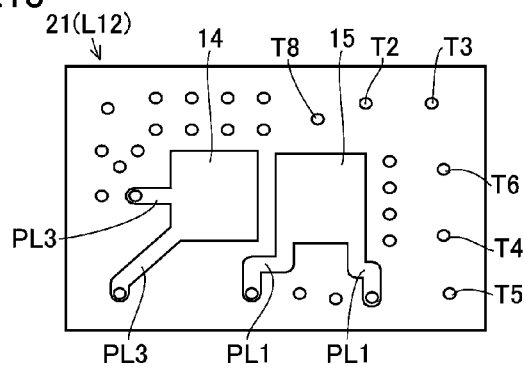
FIG. 18 is a diagram illustrating a layer L12 of the multilayer substrate 21.

Referring to FIG. 18, for example, the electrode of the capacitor 14, the electrode of the capacitor 15, a portion of the voltage supply line PL1, and a portion of the voltage supply line PL3 are provided as the wiring patterns on the layer L12.

Figure 19:
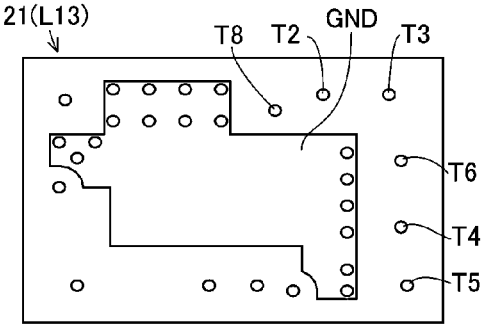
FIG. 19 is a diagram illustrating a layer L13 of the multilayer substrate 21.

Referring to FIG. 19, for example, the ground surface is provided by the wiring pattern on the layer L13. Since the layer L13 includes the ground surface, for example, the isolation between the respective layers is ensured.

Figure 20:
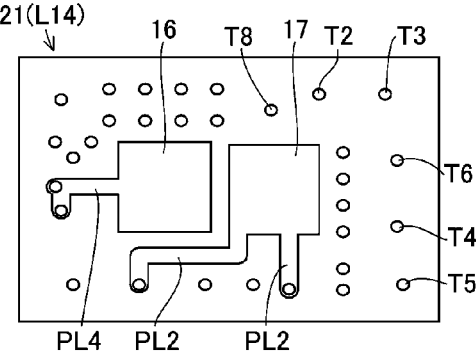
FIG. 20 is a diagram illustrating a layer L14 of the multilayer substrate 21.

Referring to FIG. 20, for example, the electrode of the capacitor 16, the electrode of the capacitor 17, a portion of the voltage supply line PL2, and a portion of the voltage supply line PL4 are provided as the wiring patterns on the layer L14.

Figure 21:
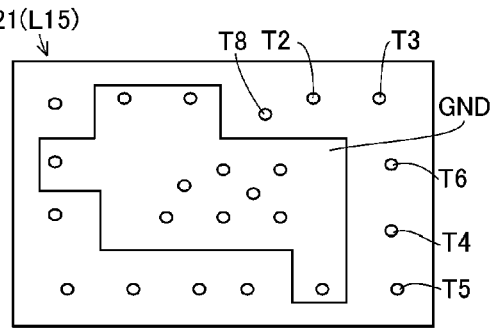
FIG. 21 is a diagram illustrating a layer L15 of the multilayer substrate 21.

Referring to FIG. 21, for example, the ground surface is provided by the wiring pattern on the layer L15. Since the layer L15 includes the ground surface, for example, the isolation between the respective layers is ensured.

Referring to FIG. 22, for example, the terminals T1 to T6 and T8 are provided on the layer L16. In addition to the terminals T1 to T6 and T8, various terminals to access the outside of the antenna matching apparatus 20B are provided on the layer L16. For example, a terminal "VDD" is a terminal to supply the power supply voltage VDD to the switches 11-1, 11-2, 12-1, and 12-2. The terminal "CTL1", the terminal "CTL2", the terminal "CTL3", and the terminal "CTL4" are terminals to supply the respective control signals to control the switches 12-1, 12-2, 11-1, and 11-2, respectively. The terminals "GND" are terminals to supply the reference potential (GND) to the antenna matching apparatus 20B.

Some capacitors included in the antenna matching apparatus 20B include multiple wiring patterns that are provided on different layers of the multilayer substrate 21 and that are opposed to each other.

Specifically, one electrode of the capacitor 4 is provided on the layer L5 (FIG. 11) and the layer L7 (FIG. 13) and the other electrode thereof is provided on the layer L6 (FIG. 12) and the layer L8 (FIG. 14). One electrode of the capacitor 6 is provided on the layer L6 (FIG. 12) and the lay L8 (FIG. 14) and the other electrode thereof is included in the ground surface on the layer L5 (FIG. 11) and the ground surface on the layer L9 (FIG. 15). One electrode of the capacitor 8 is provided on the layer L7 (FIG. 13) and the other electrode thereof is included in the electrode of the capacitor 6 on the layer L6 (FIG. 12) and the layer L8 (FIG. 14). One electrode of each of the capacitors 14 and 15 is provided on the layer L12 (FIG. 18) and the other electrode of each of the capacitors 14 and 15 is included in the ground surfaces on the layer L11 (FIG. 17) and the layer L13 (FIG. 19). One electrode of each of the capacitors 16 and 17 is provided on the layer L14 (FIG. 20) and the other electrode of each of the capacitors 16 and 17 is included in the ground surfaces on the layer L13 (FIG. 19) and the layer L15 (FIG. 21).

In addition, in the multilayer substrate 21 of the antenna matching apparatus 20B, one end of the switch 11-1 is arranged above the terminal T2 to be connected to the terminal T2 and the other end thereof is arranged above the terminal T3 to be connected to the terminal T3. One end of the switch 11-2 is arranged above the terminal T3 to be connected to the terminal T3 and the other end thereof is arranged above the terminal T8 to be connected to the terminal T8. One end of the switch 12-1 is arranged above the terminal T4 to be connected to the terminal T4 and the other end thereof is arranged above the terminal T5 to be connected to the terminal T5. One end of the switch 12-2 is arranged above the terminal T5 to be connected to the terminal T5 and the other end thereof is arranged above the terminal T6 to be connected to the terminal T6. Each terminal of the switches 11-1, 11-2, 12-1, and 12-2 arranged on the layer L1 (FIG. 7) is connected to each terminal on the layer L16 (FIG. 22) with approximately the shortest distance with almost no wiring pattern interposed therebetween in the multilayer substrate 21. This reduces parasitic inductance caused by, for example, the length of the wiring patterns.

Although the realization of the antenna matching apparatus 20B including the multilayer substrate 21 is described above with reference to FIG. 7 to FIG. 22, the antenna matching apparatus 20 illustrated in FIG. 1 and the antenna matching apparatus 20A illustrated in FIG. 4 are also realized using the multilayer substrate 21 by appropriately changing the wiring patterns of the multilayer substrate 21.

Referring back to FIG. 6, it is preferred in the antenna matching apparatus 20B that the isolation between the switches 12-1 and 12-2 in the high band and the switches 11-1 and 11-2 in the low band be increased. As described above, for example, an SPDT switch is preferably used for each switch and these switches can be integrated on one chip. However, the integration of all of the switch 12-1 and the switch 12-2 in the high band and the switch 11-1 and the switch 11-2 in the low band on one chip makes difficult to ensure the isolation between the high band and the low band. Accordingly, in the antenna matching apparatus 20B, the switch circuit 12 including the switch 12-1 and the switch 12-2 in the high band and the switch circuit 11 including the switch 11-1 and the switch 11-2 in the low band are separately provided, as illustrated in FIG. 7. The effects of this configuration will now be described with reference to FIG. 23 to FIG. 25.

Figure 23:
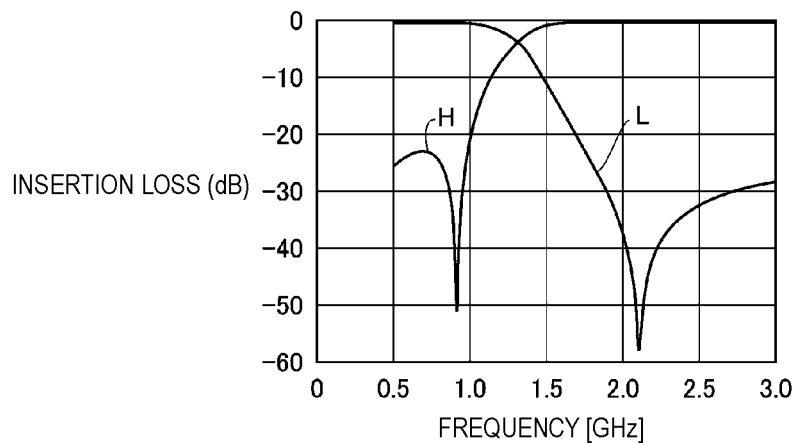
FIG. 23 is a graph illustrating bandpass characteristics (insertion loss) of a diplexer 100A illustrated in FIG. 6.

FIG. 23 is a graph illustrating bandpass characteristics (insertion loss) of the diplexer 100A illustrated in FIG. 6. In the graph illustrated in FIG. 23, "H" indicates the bandpass characteristic of a path at the high band side and "L" indicates the bandpass characteristic of a path at the low band side. "H" indicates the bandpass characteristic between the terminal T1 and the terminal T2 illustrated in FIG. 6. "L" indicates the bandpass characteristic between the terminal T1 and the terminal T4 illustrated in FIG. 6 (it is assumed that the characteristics of the phase circuit 220A are not considered).

As illustrated in FIG. 23, the bandpass characteristic H at the high band side exposes excellent bandpass characteristic in the high band (1,500 MHz or higher) and exposes excellent attenuation characteristics in the low band (1,200 MHz or lower). The bandpass characteristic L at the low band side exposes excellent bandpass characteristic in the low band and exposes excellent attenuation characteristics in the high band.

Figure 24:
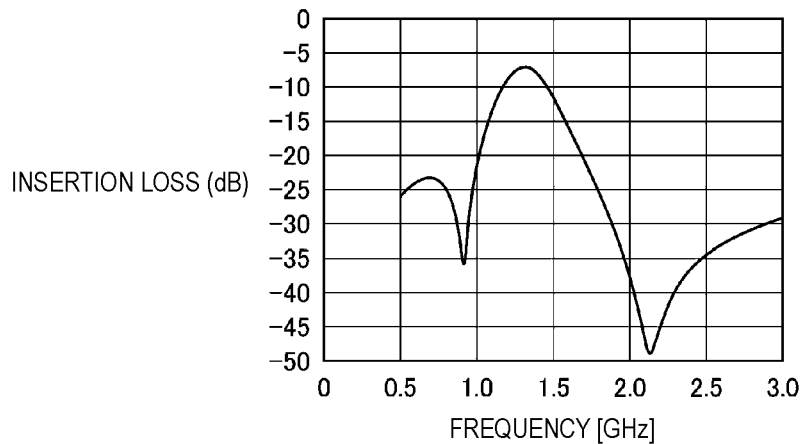
FIG. 24 is a graph illustrating a result of an experiment of an isolation characteristic in a configuration including the diplexer 100A, a switch circuit 11, and a switch circuit 12 illustrated in FIG. 6.

FIG. 24 is a graph illustrating a result of an experiment of an isolation characteristic in a configuration including the diplexer 100A, the switch circuit 11, and the switch circuit 12 illustrated in FIG. 6. The isolation characteristic illustrated in FIG. 24 corresponds to, for example, the insertion loss between the terminal T3 and the terminal T5 (it is assumed that the characteristics of the phase circuit 220A are not considered). Here, the isolation characteristic is measured in a state in which the switch 11-1 and the switch 12-1 are turned on. In the example illustrated in FIG. 24, the switch circuit 11 and the switch circuit 12 are separately provided, as illustrated in FIG. 7.

FIG. 24 indicates that attenuation (that is, isolation) of about −50 dB at most is achieved in the high band (1,500 MHz or higher) and the low band (1,200 MHz or lower). This isolation is greater than that in a comparative example described below. Accordingly, according to the present preferred embodiment, the excellent isolation characteristic is realized.

Figure 25:
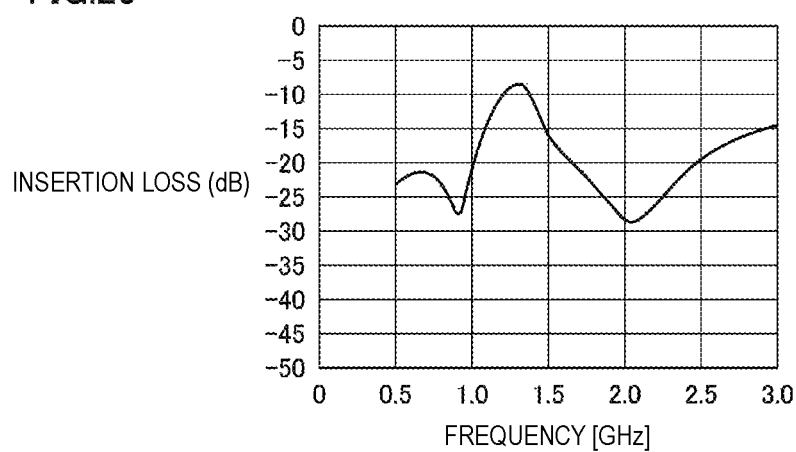
FIG. 25 is a diagram illustrating a result of an experiment of an isolation characteristic as a comparative example.

FIG. 25 is a diagram illustrating an isolation characteristic as a comparative example. FIG. 25 illustrates a result of an experiment of an isolation characteristic when the switch circuit 11 and the switch circuit 12 illustrated in FIG. 6 are integrated on one chip.

FIG. 25 indicates that isolation of only about −28 dB at most is achieved in the high band (1,500 MHz or higher) and the low band (1,200 MHz or lower).

The integration of the switch for the high band and the switch for the low band on one chip in the above manner makes difficult to ensure the isolation between the high band and the low band, as illustrated in FIG. 25. Separately providing the switch 12-1 and the switch 12-2 for the high band and the switch 11-1 and the switch 11-2 for the low band, as in the antenna matching apparatus 20B illustrated in FIG. 7, ensures the isolation between the high band and the low band, as illustrated in FIG. 24.

The switches included in the antenna matching apparatuses according to the preferred embodiments may be replaced with variable capacitance elements. In other words, as in the switch 340 and the switch 350 described above with reference to FIG. 4, the variable capacitance elements may be arranged, instead of the switches 310, 320, and 330, in the configurations illustrated in FIG. 1 to FIG. 5. Similarly, the variable capacitance elements may be arranged, instead of the switches 11-1, 11-2, 12-1, and 12-2, in the configuration illustrated in FIG. 6.

The preferred embodiments disclosed here are only examples and should be considered not to be limitations. The sprit and scope of the present invention are not illustrated by the description of the preferred embodiments but are illustrated by the appended claims. All modifications within the meanings and the spirit and scope equivalent to those of the appended claims may fall within the spirit and scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An antenna matching apparatus comprising:
   a first terminal to be connected to a transmission-reception circuit;
   a high pass filter including a first end connected to the first terminal, and transmitting a signal in a first frequency band;
   a low pass filter including a first end connected to the first terminal, and transmitting a signal in a second frequency band lower than the first frequency band;
   a second terminal connected to a second end of the high pass filter;
   a first switch including a first end connected to the second end of the high pass filter;
   a third terminal connected to a second end of the first switch;
   a fourth terminal connected to a second end of the low pass filter;
   a second switch including a first end connected to the second end of the low pass filter; and
   a fifth terminal connected to a second end of the second switch.

2. The antenna matching apparatus according to claim 1, wherein a signal in the first frequency band is input into and output to the first terminal and, simultaneously, a signal in the second frequency band is input into and output to the first terminal.

3. The antenna matching apparatus according to claim 1, further comprising:
   a third switch including a first end connected to the second end of the second switch; and
   a sixth terminal connected to a second end of the third switch.

4. The antenna matching apparatus according to claim 3, further comprising:
   a fourth switch including a first end connected to the second end of the low pass filter; and
   a seventh terminal connected to a second end of the fourth switch.

5. The antenna matching apparatus according to claim 1, further comprising at least one phase circuit provided between the second end of the low pass filter and the first end of the second switch.

6. The antenna matching apparatus according to claim 5, wherein the at least one phase circuit rotates a phase of a signal having a certain frequency in the second frequency band by 90 degrees.

7. The antenna matching apparatus according to claim 5, wherein the at least one phase circuit includes a distributed constant line.

8. The antenna matching apparatus according to claim 5, wherein the at least one phase circuit includes a lumped constant circuit.

9. The antenna matching apparatus according to claim 1, wherein the low pass filter and the high pass filter each include an inductor and a capacitor.

10. The antenna matching apparatus according to claim 9, wherein the inductor includes a wiring pattern provided on a substrate.

11. The antenna matching apparatus according to claim 10, wherein the substrate is a multilayer substrate including a voltage supply line to supply voltage to at least one of the switches and a bypass capacitor provided on the voltage supply line; and
    the bypass capacitor includes a plurality of wiring patterns, opposed to each other, on different layers of the multilayer substrate.

12. The antenna matching apparatus according to claim 1, wherein the first frequency band is about 1,500 MHz to about 3,500 MHz and the second frequency band is about 600 MHz to about 1,200 MHz.

13. The antenna matching apparatus according to claim 1, wherein the high pass filter and the low pass filter define a diplexer.

14. The antenna matching apparatus according to claim 1, wherein the antenna matching apparatus includes two matching elements for two antennae.

15. The antenna matching apparatus according to claim 14, wherein each of the two matching elements includes an inductor.

16. The antenna matching apparatus according to claim 1, wherein the antenna matching apparatus includes three matching elements for one antenna.

17. The antenna matching apparatus according to claim 16, wherein each of the three matching elements includes an inductor.

18. The antenna matching apparatus according to claim 16, wherein each of the high pass filter and the low pass filter includes at least two capacitors and at least two inductors.

19. The mobile communication terminal comprising the antenna matching apparatus according to claim 1.

20. The mobile communication terminal according to claim 19, further comprising the transmission-reception circuit connected to the first terminal of the antenna matching apparatus.

* * * * *